United States Patent [19]

Trinh et al.

[11] Patent Number: 5,057,712
[45] Date of Patent: Oct. 15, 1991

[54] ADDRESS TRANSITION DETECTOR FOR PROGRAMMABLE LOGIC ARRAY

[75] Inventors: Cuong Trinh, Daly City; Vincent K. Z. Win, Milpitas; Behzad Nouban, Mountain View; Andrew K. Chan, Palo Alto, all of Calif.

[73] Assignee: Advanced Micro Device, Inc., Sunnyvale, Calif.

[21] Appl. No.: 414,312

[22] Filed: Sep. 29, 1989

[51] Int. Cl.$^5$ .................. H03K 17/16; G06F 7/38
[52] U.S. Cl. ..................... 307/465; 307/443; 307/450; 307/468; 307/471; 307/242; 307/573; 307/576
[58] Field of Search ............... 307/443, 448, 450, 465, 307/468–469, 480, 242–243, 573, 576, 471

[56] References Cited

U.S. PATENT DOCUMENTS 4,831,285  5/1989  Gaisen ................................. 307/443
4,893,033  1/1990  Itano et al. ......................... 307/465
4,906,870  3/1990  Gongwen ............................ 307/465

Primary Examiner—Stanley D. Miller
Assistant Examiner—Margaret R. Wambach
Attorney, Agent, or Firm—Benman & Collins

[57] ABSTRACT

An improved address transition detector for use in PAL circuits is disclosed. The invention provides a predetermined logical output on a transition detection signal (TDS) bus for a transition of the input address on an input pad of the PAL. The TDS bus is used to trigger a phi generator which controls sense amplifiers and latch blocks on the PAL such that the circuitry is maintained in a low power stand-by mode. The detector includes a first inverter for buffering the address input to provide a first signal, a second inverter for inverting the first signal to provide a second signal and a comparator for providing the predetermined logical level on the TDS bus for a period of time after the first signal and the second signal have changed states.

9 Claims, 2 Drawing Sheets

1

ADDRESS TRANSITION DETECTOR FOR PROGRAMMABLE LOGIC ARRAY

BACKGROUND OF THE INVENTION

1. Field of the Invention

The present invention relates to programmable logic arrays (PLAs). More specifically, the present invention relates to address transition detectors used in programmable array logic (PAL) circuits.

While the present invention is described herein with reference to illustrative embodiments for particular applications, it should be understood that the invention is not limited thereto. Those having ordinary skill in the art and access to the teachings provided herein will recognize additional modifications, applications and embodiments within the scope thereof and additional fields in which the present invention would be of significant utility.

2. Description of the Related Art

Programmable logic arrays provide 'glue logic' for PC (printed circuit) boards and provide other types of PC board logic. Glue logic is the logic required to interface two PC boards and to interface other PC board circuitry. Glue logic generally includes a plurality of AND gates, OR gates and input/output (I/O) buffers. PLAs may also contain other logic elements including registers and flip-flops. PLAs consume less space and therefore generally provide circuit logic in a less costly manner than individual logic gates.

PLAs also offer the advantage of reconfigurability over discrete or individual gates. That is, PLAs generally include an array of AND gates, an array of OR gates, and some provision for interconnecting the outputs of selected AND gates to the inputs of selected OR gates. PLAs allow a wide variety of logic functions to be implemented through the combination, via the OR gates, of the product terms provided by the AND gates. Further, the configuration of the array may be quickly, easily and relatively inexpensively reprogrammed to implement other functions.

As described in U.S. Pat. No. 4,124,899, programmable array logic (PAL) circuits were developed to provide further improvements in the speed, space requirements, cost and power consumption of PLAs. PALs generally provide programmable AND and fixed OR functions. In a most general sense, a PAL provides a field programmable logic array in which a programmable array of circuit inputs are provided to a plurality of AND gates (cells) to generate product terms. Outputs from subgroups of AND gates are, in turn, nonprogrammably connected as inputs to individual, specified OR gates to provide the sum of products. In many cases, PALs also include other types of logic elements.

PALs are often used in applications where power consumption must be limited. That is, low power consumption of PALs may extend the operating life of battery operated circuits such as that of laptop computers and cellular phones. In addition, reduced PC board power consumption allows for smaller and less expensive power supplies, reduced system cooling requirements and, thus, reduced overall package size.

Many conventional PALs use address transition detectors to turn off subcircuits when the PAL inputs are at a steady-state, thus reducing the power consumption of the device. The detectors turn off circuitry when the PAL is at steady-state and then turn the PAL circuitry back on when a transition is made on any of the PAL inputs.

Typical address transition detectors utilize exclusive-NOR gates. Exclusive-NOR address transition detectors generally have a high device count and therefore tend to require considerable die surface area. Further, circuit design to achieve a particular pulse width for the transition detection signal is difficult.

Thus, there is a need in the art for an address transition detector for PAL circuits that requires less die surface area, is easy to implement and provides a controllable transition detection signal.

SUMMARY OF THE INVENTION

The need in the art is provided by the improved address transition detector of the present invention. The detector is for use in PAL circuits to provide a predetermined logical output on a transition detection signal (TDS) bus on a transition of the address at an input pad or input/output pad of the PAL. The TDS bus is used to trigger a phi generator which controls sense amplifiers and latch blocks on the PAL such that the circuitry is in a low power stand-by mode except when the TDS bus is at the predetermined logical level. The address transition detector of the present invention includes a first inverter for buffering the input address to provide a first signal, a second inverter for inverting the first signal to provide a second signal and a comparator for providing the predetermined logical output on the TDS bus for a period of time after the first and second signals have changed states. The present teachings further disclose fabrication techniques for providing the desired pulse width for the desired logic level output on the TDS bus.

DESCRIPTION OF THE INVENTION

Figure 1:
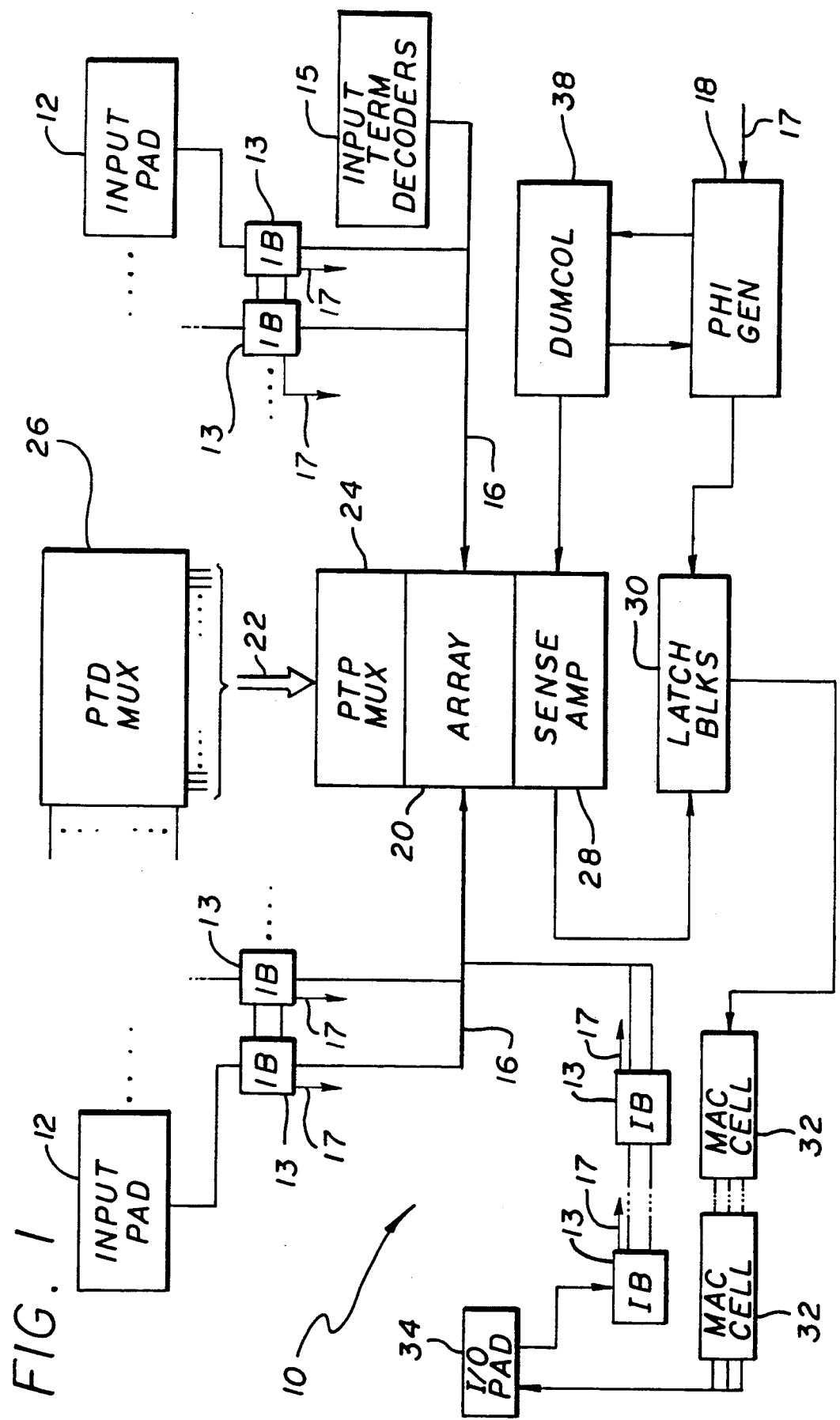
FIG. 1 is a simplified block diagram of an illustrative programmable array logic system.

FIG. 1 is a simplified block diagram of an illustrative programmable array logic (PAL) system 10. As is generally known in the art, the PAL 10 is a programmable logic array of a particularly advantageous design providing 'glue logic' for circuit interconnection at high speed with minimal power consumption. The PAL 10 includes a plurality of input pads 12 and input/output (I/O) pads 34 which are typically probe pads with electrostatic protection circuitry (not shown). The input pads 12 and I/O pads 34 facilitate the bonding of a first circuit to another circuit via the 'glue logic' provided by the PAL 10. Each input pad 12 is connected to an input buffer (IB) 13. Each input buffer 13 includes an address transition detector (not shown) for detecting address transitions at a corresponding input pad 12. As discussed more fully below, the present invention provides an improved address transition detector.

Each input buffer 13 is connected to a first bus 16 and a phi generator 18 through a TDS bus 17. Input term decoders 15 are also connected to the first bus 16. The first bus 16 communicates with an array 20. The array 20 typically provides an electrically erasable (E2) cell array of AND gates (not shown). As is known in the art, each input of each AND gate of the array 20 may be programmably interconnected to a selected line of an input data bus 16. A set of sense amplifiers 28 are connected to the array 20. The sense amplifiers 28 are connected to a plurality of latch blocks 30, one for each group of outputs of the sense amplifier 28. The latch blocks 30 are each connected to a macrocell 32, each of which, in turn, may be connected to one of a plurality of I/O pads 34. The I/O pads 34 may double as input pads when data is propagated in a reverse direction through the PAL 10 via the input buffers 13.

In a normal (nonprogramming) mode of operation, the PAL 10 is in a standby mode consuming little or no power. When the input to an input pad 12 or I/O pad 34 is switched, the input data terms propagate through the associated input buffer 13 to the array 20. The address transition detector 14 (not shown) in the input buffer 13 detects the address change at the associated input pad 12 or I/O pad 34 and triggers the phi generator 18 by sending a pulse on the TDS bus 17. When triggered, the phi generator 18 generates a pulse to the sense amplifiers 28 and the sense amplifiers 28 turn on from an initial standby state in which little or no power is consumed. After a predetermined delay, the phi generator 18 sends 'BLTCH' and 'LTCH' signals to the latch blocks 30. Input data from the input buffer 13 is used by the array 20 to change the states of the product terms. The sense amplifiers 28 detect a state change in the array 20 and drive the latch blocks 30 with product terms therefrom. The 'BLTCH' and 'LTCH' signals from the phi generator 18 enable the latch blocks 30 so that when data is available from the sense amplifiers 28 it is detected and latched by the latch blocks 30 and used to drive the macrocells 32. The macrocells 32 provide register and other output functions (e.g. enable control, D flip-flop, set and reset control and other information and state control) to the associated output pad.

The timing of the latching function is critical to successful operation of the system 10. If the data is latched early, incorrect data may be output. If the data is latched late, the device may operate at a slower than optimal speed. Accordingly, a dummy column 38 is provided which is essentially a capacitive load. The dummy column 38 is a delay circuit which models the propagation of data through the array 20 to the latch blocks 30. The dummy column 38 therefore provides proper timing for the phi generator 18.

Figure 2:
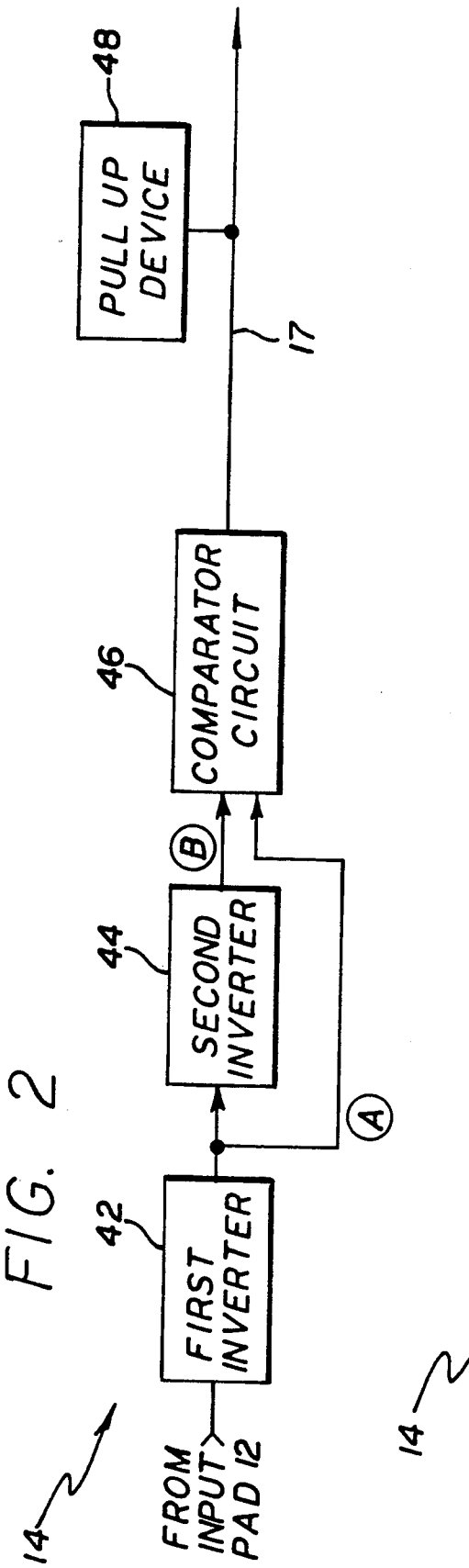
FIG. 2 is a simplified block diagram of the improved address transition detector of the present invention.

FIG. 2 is a simplified block diagram of the improved address transition detector 14 of the present invention. The detector 14 includes a first inverter 42, a second inverter 44 and a comparator circuit 46 for providing an output pulse on the TDS bus 17 if the state of the address input on the input pad 12 or I/O pad 34 changes. The address input is provided to the first inverter 42 which inverts the address input to provide a 'new' signal therefrom. This new signal is in turn provided to the second inverter 44 which inverts the new signal to provide an 'old' signal. As discussed more fully below, the comparator 46 receives both the new and old signals and provides a low logic level output pulse on the TDS bus 17 when the new and old signals have changed states. The comparator 46 is configured such that its output will be in a high-impedance state when the comparator 46 is not providing a low logic level output pulse on the TDS bus 17. A pull-up device 48 is then used to provide a normally high logic level on the TDS bus 17. Thus, any one of the address transition detectors 14 can provide a low logic level output pulse on the TDS bus 17 when an address transition is detected.

At steady state, the old signal will be the opposite logic level from the new signal because the new and old signals are the inverse of one another. Upon a change in the logic level of the address input on the input pad 12 or I/O pad 34, the old signal will transition a short time later than the new signal because of the delay through the second inverter 44. The comparator 46 will magnify this delay and provide two signals (corresponding to the old signal and the new signal) that are at the same logic level for a longer period of time. Therefore, when an address transition occurs, for a short period of time the two signals provided to the comparator 46 will be the same logic level and in response the comparator 46 will output a low logic level pulse on the TDS bus 17. Thus, the comparator 46 operates as an exclusive-OR circuit. The charge and discharge characteristics of the transistor circuits of the comparator 46 determine the length of time that a low logic level pulse is output on the TDS bus 17 as discussed more fully below.

Figure 3:
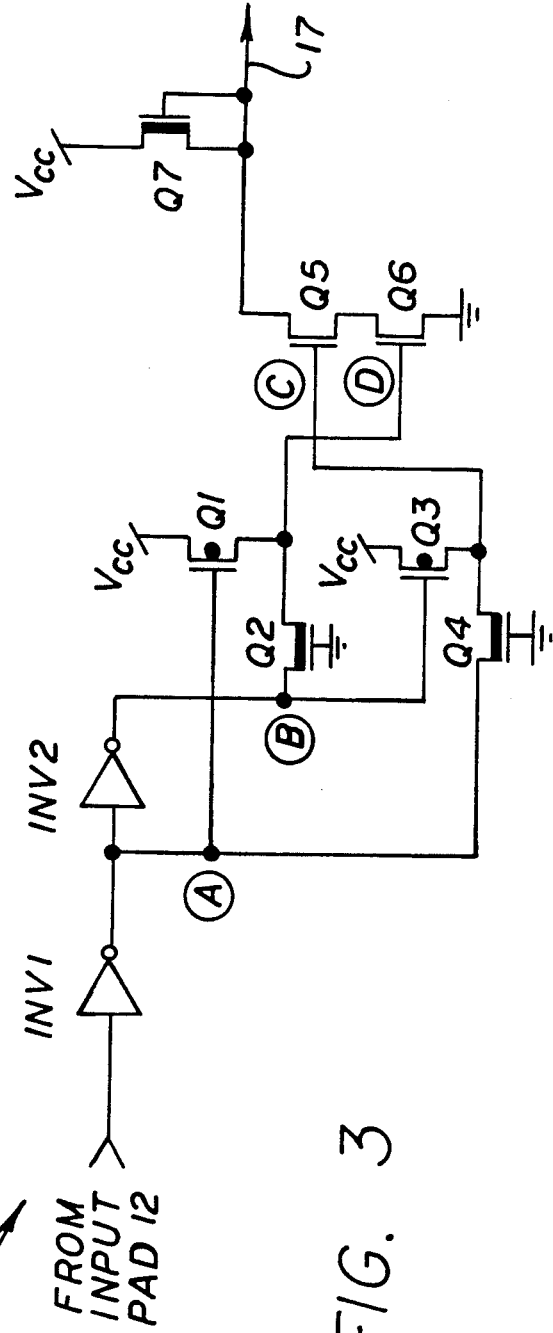
FIG. 3 is an illustrative schematic diagram of the improved address transition detector of the present invention.

FIG. 3 is an illustrative schematic diagram of the improved address transition detector 14 of the present invention. In the preferred embodiment, the detector 14 is implemented in CMOS (complementary metal-oxide-semiconductor) technology. Those skilled in the art will recognize that other technologies may be utilized to implement the detector 14 without departing from the scope of the present invention. The detector 14 includes a first inverter INV1 output connected to the input of a second inverter INV2, the gate of a first p-channel transistor Q1 and to the drain of a second n-channel depletion mode transistor Q4. The output of the second inverter INV2 is connected to the drain of a first n-channel depletion mode transistor Q2 and to the gate of a second p-channel transistor Q3. The drain of the first p-channel transistor Q1 is connected to the source of the first n-channel depletion mode transistor Q2 and to the gate of a second n-channel enhancement mode transistor Q6. Similarly, the drain of the second p-channel transistor Q3 is connected to the source of the second n-channel depletion mode transistor Q4 and to the gate of a first n-channel enhancement mode transistor Q5. The source of the first n-channel enhancement mode transistor Q5 is connected to the drain of the second n-channel enhancement mode transistor Q6 and the drain of the first n-channel enhancement mode transistor Q5 provides the output on the TDS bus 17. The sources of both the first and second p-channel transistors Q1 and Q3 are connected to a source of supply voltage, Vcc. In addition, the gates of both the first and second n-channel depletion mode transistors Q2 and Q4 and the source of the second n-channel enhancement mode transistor Q6 connect to ground.

The gate and source of a third n-channel depletion mode transistor Q7 are connected together and to the TDS bus 17 to provide a pull-up for the TDS bus 17. Typically, only one pull-up device is required for the PAL 10, because, as mentioned previously, the PAL 10 generally contains multiple address transition detectors 14 with the output of each detector being connected to the TDS bus 17. Those skilled in the art will recognize that other types of pull-up devices may be employed without departing from the scope of the present invention.

In FIG. 3, node A indicates the junction between the output of the first inverter INV1 and the input of the second inverter INV2, the gate of the first p-channel transistor Q1 and the drain of the second n-channel depletion mode transistor Q4. Node B indicates the junction between the output of the second inverter INV2, the gate of the second p-channel transistor Q3 and the drain of the first n-channel depletion mode transistor Q2. Node C indicates the junction between the drain of the second p-channel transistor Q3, the source of the second n-channel depletion mode transistor Q4 and the gate of the first n-channel enhancement mode transistor Q5. Similarly, node D indicates the junction between the drain of the first p-channel transistor Q1, the source of the first n-channel depletion mode transistor Q2 and the gate of the second n-channel enhancement mode transistor Q6. (Node C and node D are internal nodes corresponding to the two signals produced by the comparator 46 in response to changes in the logic level of the old and new signal as discussed earlier).

At steady state, the first and second n-channel enhancement mode transistors Q5 and Q6 will not conduct, because either node C or node D will be at a low logic level. Thus, at steady state the TDS bus 17 will be pulled to a high logic level by the third n-channel depletion mode transistor Q7 such that the phi generator 18 maintains the sense amplifiers 28 and latch blocks 30 of the PAL 10 in a power-down mode. Only when there is a transition of the address input on the input pad 12 or I/O pad 34 will the TDS bus 17 be driven to a low logic level by the first and second n-channel enhancement mode transistors Q5 and Q6. During this time, the phi generator 18 will power-up the sense amplifiers 28 and latch blocks 30 and cause the state of the PAL 10 output pins to change as dictated by the change in the address input.

The address input from the input pad 12 or I/O pad 34 is received by the first inverter INV1 and inverted. Thus, the signal at node A represents the new signal. The second inverter INV2 inverts the new signal and the signal at node B represents the old signal. At steady state, the logic level of the new signal at node A will be identical to the logic level at node C. Similarly, the logic level of the old signal at node B will be identical to the logic level at node D. Since nodes A and B are at opposite logic levels at steady state, the TDS bus 17 will be at a high logic level. However, for a change in the address input at the input pad 12 or I/O pad 34, node C and node D will be at a high logic level at the same time for a short duration. During this time, the first and second n-channel enhancement mode transistors Q5 and Q6 will conduct such that the TDS bus 17 will be pulled to a low logic level.

The duration that the TDS bus 17 is at a low logic level is determined by the combined effects of the relative sizes of the first and second inverters INV1 and INV2, the transistor pair consisting of the first p-channel transistor Q1 and the first n-channel depletion mode transistor Q2 and the transistor pair consisting of the second p-channel transistor Q3 and the second n-channel depletion mode transistor Q4. The above mentioned transistor pairs operate as resistor-capacitor networks, and the sizes of the transistor pairs are such that the charge time at node C or node D is less than the discharge time at these nodes. A decrease in the charge time increases the duration of time that the TDS bus 17 is at a low logic level because the node C or D which was at a low logic level will change to a high logic level faster. Thus, node C and node D will both be at a high logic level for a longer period of time causing the TDS bus 17 to be at a low logic level longer. Similarly, an increase in the discharge time increases the duration that node C and node D are at a high logic level together and, in response, increases the duration that the TDS bus 17 is at a low logic level.

To decrease the charge time, the first or second p-channel transistor Q1 or Q3 can be made wider, effectively increasing the transistor's pull-up capability. To increase the discharge time, the first or second n-channel depletion mode transistor Q2 or Q4 can be lengthened, effectively increasing the transistor's impedance. A faster high-to-low transition on the output of the second inverter INV2 will decrease the discharge time at node D and decrease the charge time at node C. A faster low-to-high transition on this output of the second inverter INV2 will decrease the charge time at node D and decrease the discharge time at node C.

In summary, the address transition detector 14 will sense a change in the address input of the input pad 12 or I/O pad 34 and cause the TDS bus 17 to go to a low logic level for a short period of time in response thereto. In turn, the phi generator 18 will generate pulses which will cause the sense amplifiers 28 and the latch blocks 30 on the PAL 10 to power-up only for a short period of time after the address input transition. During this time, the phi generator 18 will cause the state of the output pins of the PAL 10 to change in response to the change in the address input of the input pad 12 or I/O pad 34. Those skilled in the art and with access to the teachings of the present invention will design address detection circuits such that the time period that the TDS bus 17 is low is appropriate for the particular application.

Table I below provides illustrative widths and lengths, in microns, of each of the circuit elements for a preferred embodiment of the invention.

TABLE I

| ELEMENT | WIDTH | LENGTH |
|---|---|---|
| INV1 | P = 20, N = 100 | P = 2.3, N = 2.1 |
| INV2 | P = 20, N = 20 | P = 1.8, N = 1.6 |
| Q1 | 6 | 1.8 |
| Q2 | 6 | 20 |
| Q3 | 12 | 1.8 |
| Q4 | 6 | 20 |
| Q5 | 30 | 1.6 |
| Q6 | 30 | 1.6 |
| Q7 | 6 | 10 |

Thus, the present invention has been described herein with reference to a particular embodiment for a particular application. Those of ordinary skill in the art with access to the teachings of the present invention will recognize additional modifications, applications and embodiments within the scope of the invention. For example, other circuits may be utilized to implement the exclusive-OR function of the address transition detector 14 of the present invention. In addition, the address transition detector 14 is not limited to use in PAL circuits, but may be utilized by other integrated circuits that would benefit from an address transition detector that requires fewer devices, is easy to implement and provides an easy to control transition detection signal.

It is therefore intended by the appended claims to cover any and all such modifications, applications and embodiments within the scope of the present invention.

Accordingly,

WHAT IS CLAIMED IS:

1. An improved address transition detector for use in programmable array logic to provide a transition detection signal when an address input changes state, said address transition detector including:

first means for receiving said address input and providing a first signal in response thereto;

second means for inverting said first signal to provide a second signal in response thereto; and an exclusive-or comparator connected to compare said first signal and said second signal and to provide a first output signal as said transition detection signal for a first period of time after said first signal and said second signal have changed logic states; and which includes means for controlling the width of said transition detection signal.

2. The invention of claim 1 wherein said first means and said second means are inverters.

3. The invention of claim 1 wherein said exclusive-or comparator includes an exclusive-or gate.

4. The invention of claim 1 wherein said width controlling means includes a first capacitor connected between the output of said second means and a first input to said comparator and a second capacitor connected between the output of said first means and a second input to said comparator said first and second capacitors each being connected to a source of supply voltage.

5. The invention of claim 4 wherein said width controlling means includes a first resistor connected between the output of said second means and the second input to said comparator and a second resistor connected between the output of said first means and the first input to said comparator, said first and second resistors each being connected to electrical ground.

6. The invention of claim 5 therefor pull-up means for providing a second output signal as said transition detection signal when said comparator is not providing said first output signal as said transition detection signal.

7. The invention of claim 6 wherein said pull-up means includes a pull-up transistor connected to the output of an output means.

8. The invention of claim 7 wherein said pull-up transistor has an input and a first terminal connected together and to the output of said output means and a second terminal connected to a source of supply voltage.

9. An improved address transition detector for use in programmable array logic to provide a transition detection signal when an address input changes state, said address transition detector including:

a first inverter connected to receive said address input and provide a first signal in response thereto;

a second inverter connected to said first inverter for inverting said first signal to provide a second signal in response thereto; and an exclusive-or comparator having first and second inputs connected to compare said first signal and said second signal respectively and to provide a first output signal as said transition detection signal for a first period of time after said first signal and said second signal have changed logic states; which includes means for controlling the width of said transition detection signal, said width controlling means comprising a resistor-capacitor network providing an exclusive-or function for properly controlling the logic level of said transition detection signal on a transition detection signal bus, said resistor-capacitor network having a first capacitor connected between the output of said second inverter and the first input to said comparator and a second capacitor connected between the output of said first inverter and the second input to said comparator, said first and second capacitors each being connected to a source of supply voltage and a first resistor connected between the output of said second means and the second input to said comparator and a second resistor connected between the output of said first means and the first input to said comparator, said first and second resistors each being connected to electrical ground.

* * * * *